United States Patent [19]
Baliga et al.

[11] Patent Number: 4,717,679
[45] Date of Patent: Jan. 5, 1988

[54] MINIMAL MASK PROCESS FOR FABRICATING A LATERAL INSULATED GATE SEMICONDUCTOR DEVICE

[75] Inventors: Bantval J. Baliga; Tat-Sing P. Chow, both of Schenectady, N.Y.

[73] Assignee: General Electric Company, Schenectady, N.Y.

[21] Appl. No.: 935,470

[22] Filed: Nov. 26, 1986

[51] Int. Cl.[4] .................... H01L 21/38; H01L 21/425
[52] U.S. Cl. ........................................ 437/29; 437/148
[58] Field of Search .............. 148/187; 29/571, 576 B, 29/578

[56] References Cited

U.S. PATENT DOCUMENTS

| | | | |
|---|---|---|---|
| 4,199,774 | 4/1980 | Plummer | 357/41 |
| 4,300,150 | 11/1981 | Colak | 357/23.8 X |
| 4,409,606 | 11/1983 | Wagenaar et al. | 357/23.8 X |
| 4,446,176 | 8/1984 | Temple | 29/576 B |
| 4,532,534 | 7/1985 | Ford et al. | 357/23.14 X |

OTHER PUBLICATIONS

General Electric Company, Corporate Research and Development Center Docket RD-16,869, Ser. No. 935,368, filed 11/26/86, titled Insulated Gate Transistor With Vertical Integral Diode and Method of Fabrication, Inventor(s) B. J. Baliga et al.

Article "Analysis of the Lateral Insulated Gate Transistor" by M. R. Simpson, P. A. Gough, F. I. Hshieh and V. Rumennik, published in the Technical Digest of the International Electron Device Meeting, 1985, pp. 740–743.

Primary Examiner—George T. Ozaki
Attorney, Agent, or Firm—Robert Ochis; James C. Davis, Jr.; Marvin Snyder

[57] ABSTRACT

An eight mask process for forming a lateral insulated gate semiconductor device is disclosed. The gate structure can be used as a mask to align the third and fifth regions of the device and a third protective layer aligns the fourth and sixth regions of the device.

31 Claims, 17 Drawing Figures

MINIMAL MASK PROCESS FOR FABRICATING A LATERAL INSULATED GATE SEMICONDUCTOR DEVICE

RELATED APPLICATIONS

This application is related to U.S. patent application Ser. No. 935,368 for an "Insulated Gate Transistor With Vertical Integral Diode" filed concurrently herewith and assigned to the assignee hereof and the totality of which is incorporated by reference herein.

BACKGROUND OF THE INVENTION

The present invention relates generally to processes for fabricating insulated gate semiconductor devices and more particularly, to a process for fabricating a lateral insulated gate transistor such as the improved lateral insulated gate transistor disclosed in the aforementioned patent application Ser. No. 935,368. Heretofore, lateral insulated gate semiconductor devices have been commonly fabricated using 14 different masks. In a typical 14 mask process, a first mask is used to establish a charge control region, a second mask is used to establish a buried layer, a third mask is used for a P isolation region/sinker, a fourth mask is used to establish a buffer region, a fifth mask is used to establish the active area of the device, a sixth mask is used to establish a gate electrode, a seventh mask is used to establish a base region, an eighth mask is used to establish an anode region, a ninth mask is used to establish an N+ source region, a tenth mask is used to establish a SIPOS window, an eleventh mask is used to establish a SIPOS layer, a twelfth mask is used to establish a contact window, a thirteenth mask is used to pattern the contact metals and a fourteenth mask is used to pattern the overglass protection. It has been recognized that in devices not requiring SIPOS protection, the tenth and eleventh masks for providing SIPOS oxide deposition can be eliminated and thus only 12 masks are required to establish a lateral insulated gate device.

As known to those skilled in the art, each mask step adds additional costs to the semiconductor processing and establishes one more step in which a process failure can occur. Thus, processes which employ a large number of masks and hence large number of steps, exhibit a higher cost and a lower yield than processes which employ a fewer number of masks and a fewer number of mask steps.

OBJECTS OF THE INVENTION

It is principle object of the present invention to provide a minimal mask process for fabricating a lateral insulated gate semiconductor device such as a lateral insulated gate transistor having an integral vertical diode therein.

It is a further object of the present invention to provide a process which employs no more than 8 masks to fabricate a lateral insulated gate semiconductor device having a vertical integral diode therein.

It is a further object of the present invention to provide an 8 mask process for fabricating a lateral insulated gate transistor having a vertical integral diode therein.

It is a still further object of the present invention to provide an 8 mask process in which the gate electrode is deposited and patterned prior to the establishment of the active regions of the device to thereby advantageously employ the deposited gate electrode as a guide member to assist in alignment of the active regions of the device.

It is a further object of the present invention to control the doping concentrations and the depths of the various regions to minimize the resistance of the lateral current path within the lateral semiconductor device to minimize the on-state voltage threshold of the device.

SUMMARY OF THE INVENTION

These and other objects and features of the present invention are achieved in a minimal mask process for fabricating a lateral insulated gate semiconductor device having an integral diode therein comprising the steps of providing a first semiconductor layer of one type conductivity and then providing a second layer of opposite type conductivity semiconductor material atop the first layer. A first protective layer such as an oxide layer is established atop the second layer. A first mask is then used to open a first window in the first protective layer to expose a first portion of the surface of the second layer. The first exposed portion of the surface of the second layer is then doped with one type conductivity material to establish a first region of one type conductivity. A second protective layer is formed in the first window and a second mask is employed to open a second window through the first protective layer to expose a second portion of the surface of the second layer. Subsequently, the second portion of the surface of the second layer is doped with opposite type conductivity material to establish a second region. An oxidation resistant third protective layer such as a silicon nitride layer is formed on the exposed surface of the device and particularly in the second window. A third mask is employed to open third and fourth windows. The third window is opened through the third protective layer overlying the first and second protective layers to expose a portion of the surface of the first region and the adjacent second layer. A fourth window is opened through the third protective layer to expose a portion of the surface of the second region. A fourth protective layer such as an insulating layer which in a preferred embodiment can be an oxide layer which will subsequently serve as a gate oxide layer, is established within the third and fourth windows. Gate material such as polysilicon or polysilicide is deposited on the exposed surface of the device and coats portions of the first, second, third and fourth protective layers. Subsequently, an oxide layer is formed atop the gate material. The oxide layer atop the gate material and the gate material are patterned using a fourth mask to leave an insulated gate structure overlying a portion of the second layer. The gate material also overlies a portion of the third protective layer, which itself overlies the first protective layer which overlies the second layer. Removing the excess gate material also re-exposes a portion of the fourth protective layer which was formed in the third window and which overlies a portion of the first region and the second layer as well as a portion of the fourth protective layer disposed in the fourth window and which overlies the second region.

A first implantation of a moderate concentration of one type conductivity dopant is then performed through the preferred oxide material of the fourth protective layer but not through the third protective layer and/or the polysilicon gate layer. The implantation which occurs within the third window forms a third one type conductivity region within the second layer and overlapping the first region. A second implantation with a moderate concentration of one type conductivity dopant is also made through the fourth window and the preferred oxide of the fourth protective layer disposed in the fourth window overlying the second region to form a fourth one type conductivity region within the second region. The third region diffuses beneath and underlies the gate electrode and the fourth region diffuses beneath and underlies the first and third protective layers.

Thereafter, and in a preferred embodiment, a fifth protective layer such as a photoresist layer, is formed on the surface of the partially processed device and a fifth mask is employed to open a window exposing the fourth protective layer overlying the fourth region. Thereafter, the fourth region is again doped preferably by implantation through the preferred oxide of the fourth protective layer but not through the fifth protective layer with a heavy concentration of one type conductivity carriers to establish a heavily doped surface portion of the fourth region. Subsequently, the fifth protective layer is removed to additionally expose portions of the third protective layer overlying the second region, the fourth region and a surface portion of the fourth region as well as the fourth protective layer overlying the first and third regions. Thereafter the exposed portions of the third protective layer are removed to expose surface portions of the second and fourth regions including the surface portion of the fourth region. Portions of the first and second protective layers are also exposed.

Subsequently, a heavy concentration of opposite type conductivity material is implanted through the fourth protective layer but not through the first or second protective layers or the polysilicon gate material to establish a fifth region of opposite type conductivity within the third region and overlapping the first region. In addition, a sixth region of opposite type conductivity is preferably established by implantation into within the second layer. The sixth region overlaps the fourth region and its surface portion.

Thereafter the partially processed device can be subjected to a low temperature oxide deposition to form a sixth protective layer. A sixth mask can be used to open a first contact window through the sixth, second and fourth protective layers to facilitate the establishment of contact with the first and fifth regions. The sixth mask is also used to open a second contact window through the sixth and fourth protective layers to facilitate contact with the sixth and fourth regions.

Thereafter, a metallization layer is applied over the remaining portion of the sixth protective layer and within the first and second contact windows to make ohmic contact with the first and fifth and fourth and sixth regions, respectively. A seventh mask can be used to pattern the metallization and to divide the metallization layer into first and second separate portions of the metal layer with the first portion being electrically connected to the first and fifth regions and the second portion being connected to the fourth and sixth regions.

Subsequently, an overglass layer can be applied atop the metallization layer and an eighth mask can be used to open windows through the overglass so that terminals or other external contacts can be applied to the first and second portions of the metallization layer.

It is particularly within the scope of the present invention to provide an ohmic electrical connection to the first layer which is also connected to the same potential as the potential applied to the first and fifth regions. It is also particularly within the scope of the present invention that the first mask establishes an annular ring which encircles all of the subsequently formed device regions. The second mask is also substantially annular and in a preferred embodiment, establishes either an oval or circular region concentrically disposed within the ring defined by the first mask. In a preferred embodiment, the third mask partially overlaps the second mask and establishes a substantially annular region.

Thus, the present invention provides an efficient process for fabricating an improved lateral insulated gate semiconductor device such as a lateral insulated gate transistor having an integral diode therein. The process employs a minimum number of masks and hence, a minimum number of processing steps and thus the lateral insulated gate transistor can be fabricated with reduced costs and improved yields.

BRIEF DESCRIPTION OF THE DRAWINGS

The features of the present invention which are believed to be novel are specified with particularity in the appended claims. The invention itself, however, both as to organization and method of operation together with additional features, objects and advantages of the improved process for fabricating a lateral insulated gate transistor with vertical integral diode can be best understood by reference to the following detailed description when taken in conjunction with the accompanying drawings in which:

DETAILED DESCRIPTION OF THE PREFERRED EMBODIMENTS

The minimal mask process of the present invention provides for the establishment of a broad range of lateral insulated gate devices within a semiconductor substrate and particularly provides for the reduced cost and improved yield establishment of a lateral insulated transistor. The ensuing description will disclose several preferred embodiments of the minimal mask process of fabricating a semiconductor device as implemented in a silicone substrate because silicon devices or devices fabricated in silicon substrates make up an overwhelming majority of the currently available semiconductor devices. Consequently, the most commonly encountered applications of the method of the present invention will involve silicon substrates. Nevertheless, it is intended that the invention disclosed herein can be advantageously employed in other semiconductor materials such as germanium or gallium arsenide and is equally applicable to other semiconductor technologies. Accordingly, the application of the improved minimal mask process of the present invention should not be limited to devices fabricated in silicon substrates, but instead to should encompass those devices fabricated in a any of a number of substrates. Moveover, while the present invention discloses a number of preferred embodiments directed to silicon substrates, it is intended that these disclosures be considered as illustrative examples of the preferred embodiments of the present invention and not as limitations on the scope or applicability of the present invention.

Although the illustrated examples discuss the improved minimal mask process of the present invention in connection with the lateral insulated gate transistor, it is recognized that the present invention has broader applicability to all lateral insulated gate type devices. While the improved process of the present invention provides for reduced cost and improved yields, it is also recognized that the minimal mask process of the present invention provides for the efficient achievement of a semiconductor device structure which affords reduced cell size, reduced cell repeat distance and improved cell density.

Figure 1A:
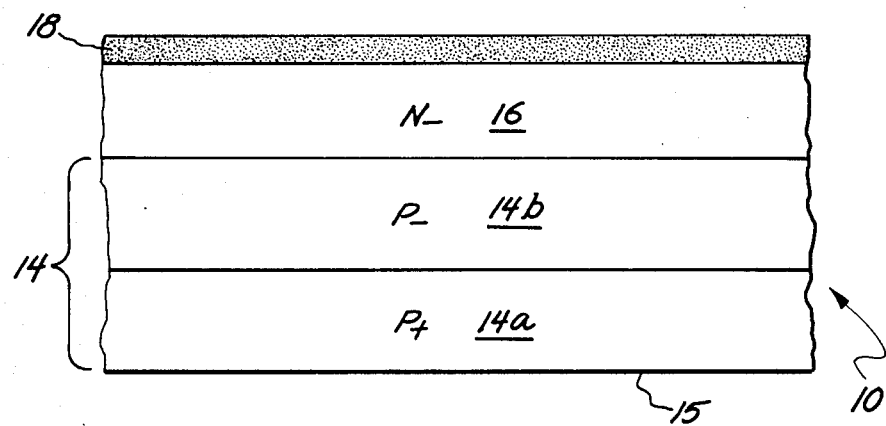
FIGS. 1A–1Q illustrate successive steps in the practice of the minimal mask process of the present invention.
Figure 1B:
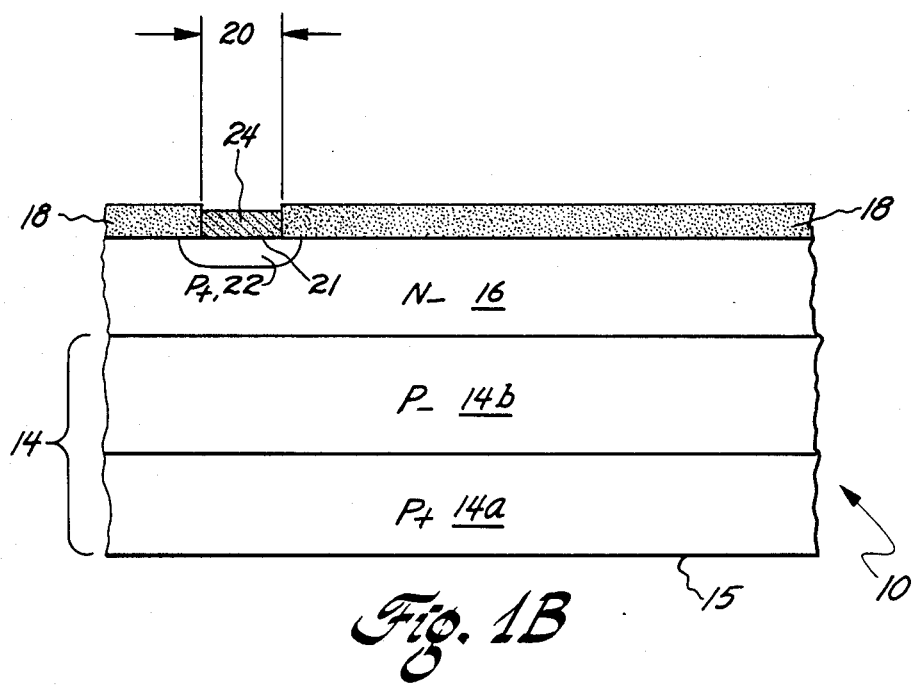
Figure 1C:
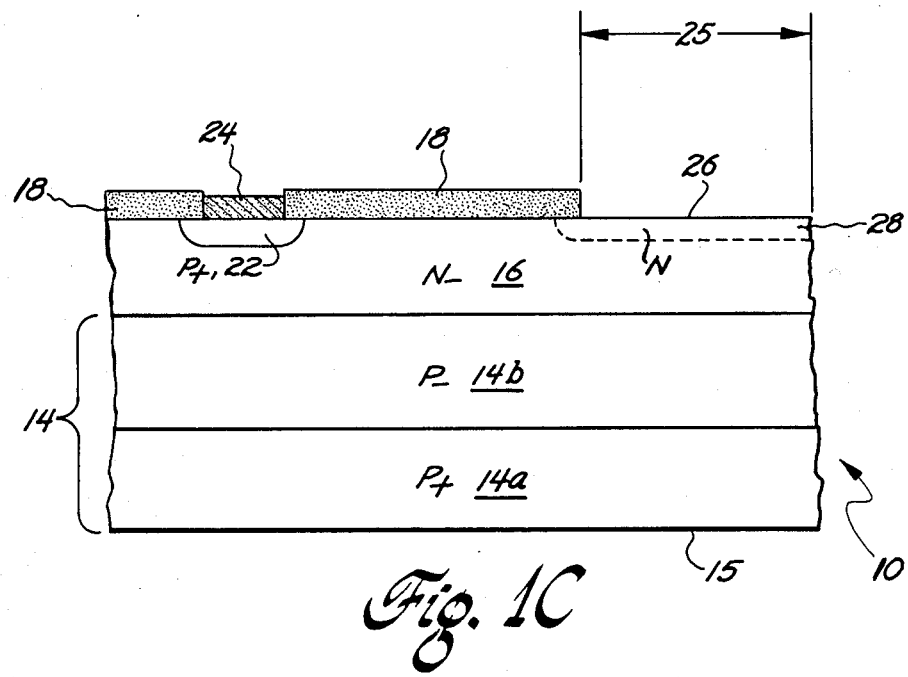
Figure 1D:
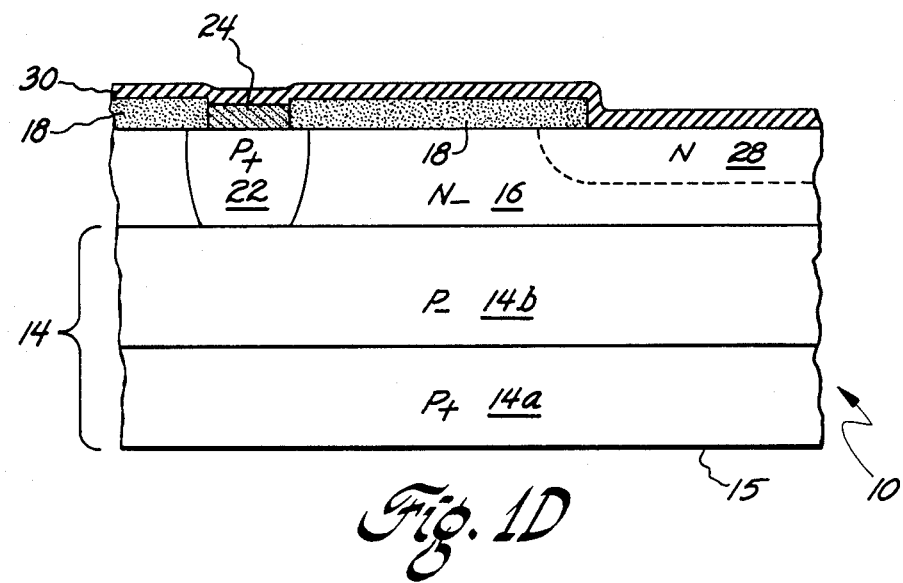
Figure 1E:
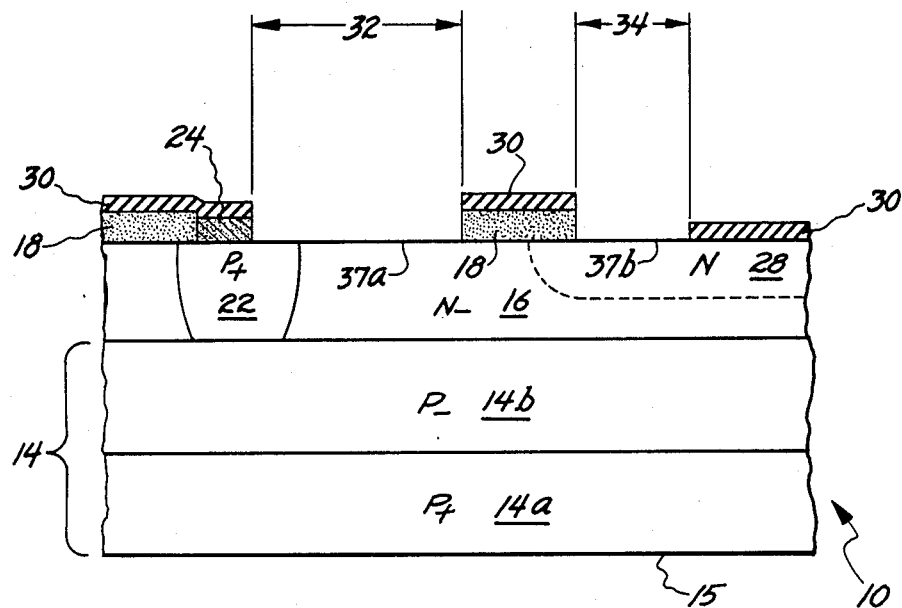
Figure 1F:
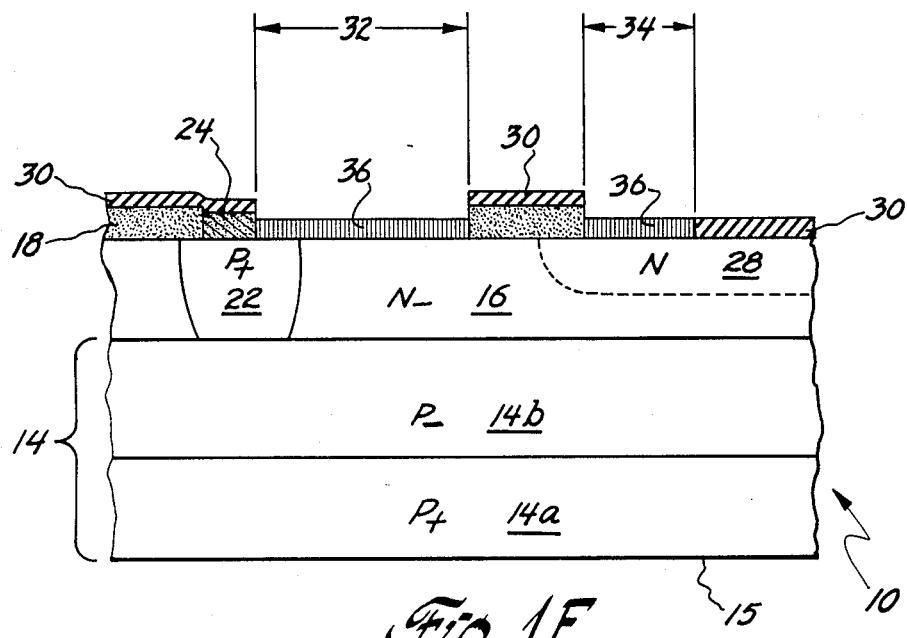
Figure 1G:
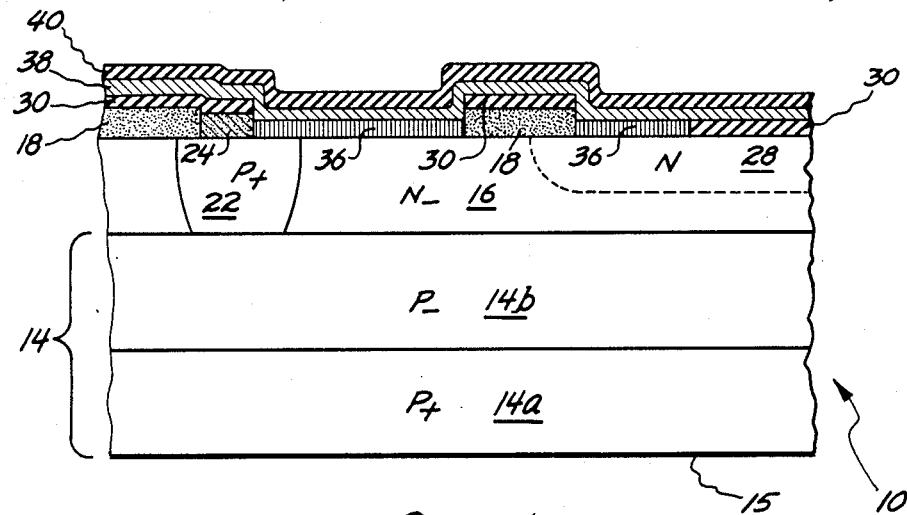
Figure 1H:
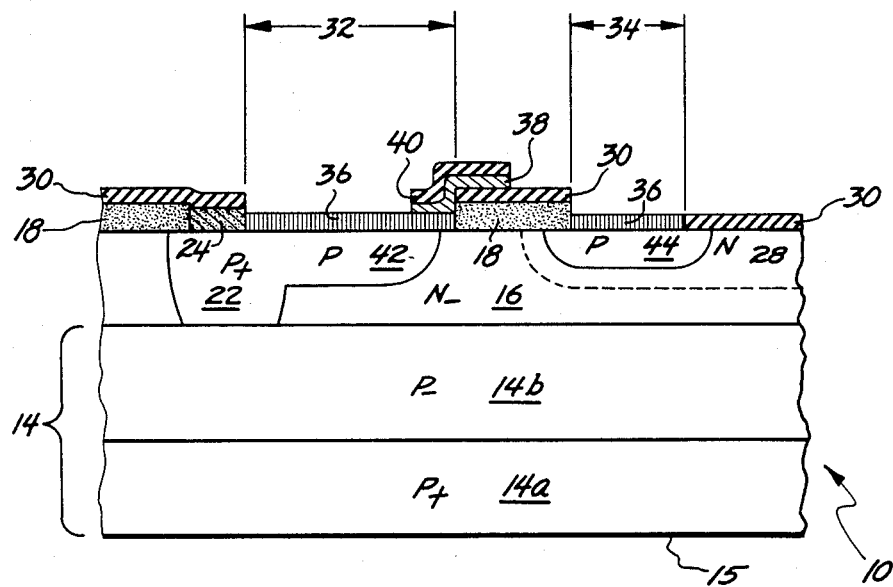
Figure 1I:
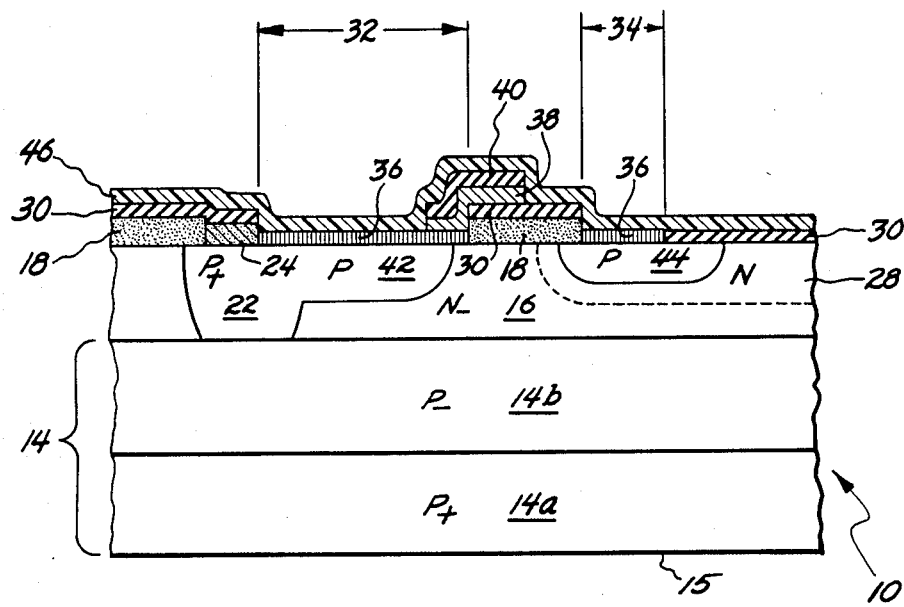
Figure 1J:
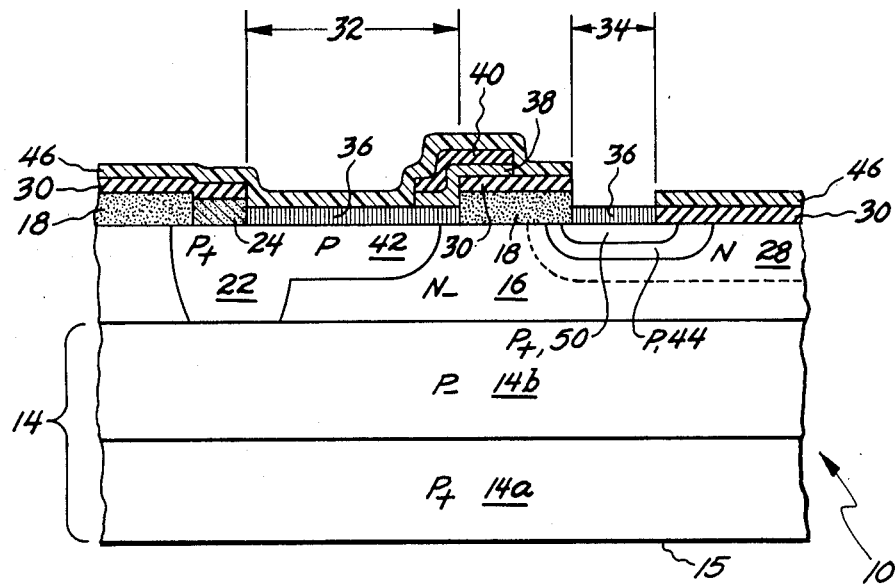
Figure 1K:
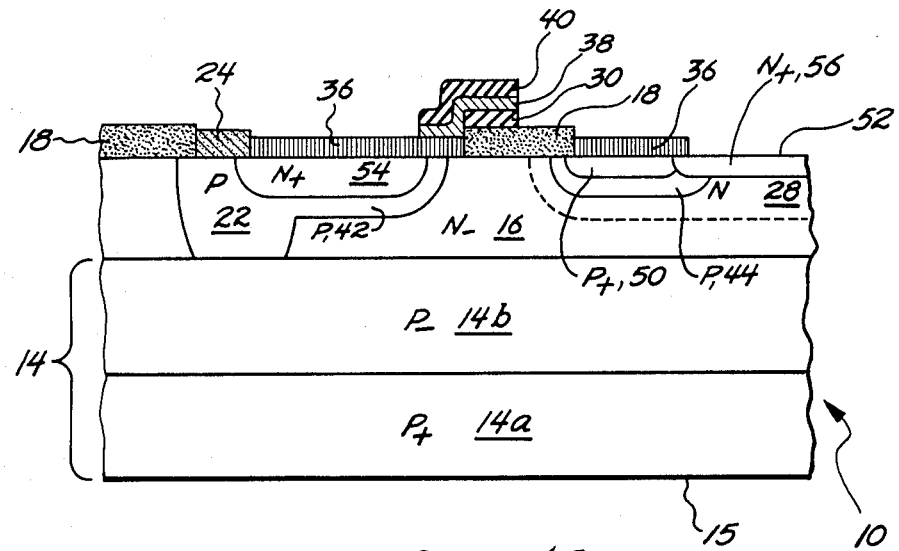
Figure 1L:
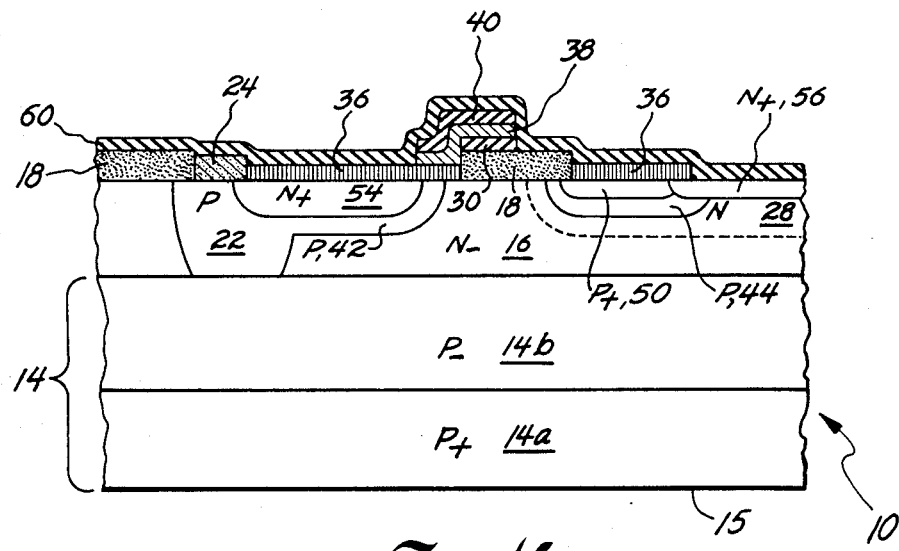
Figure 1M:
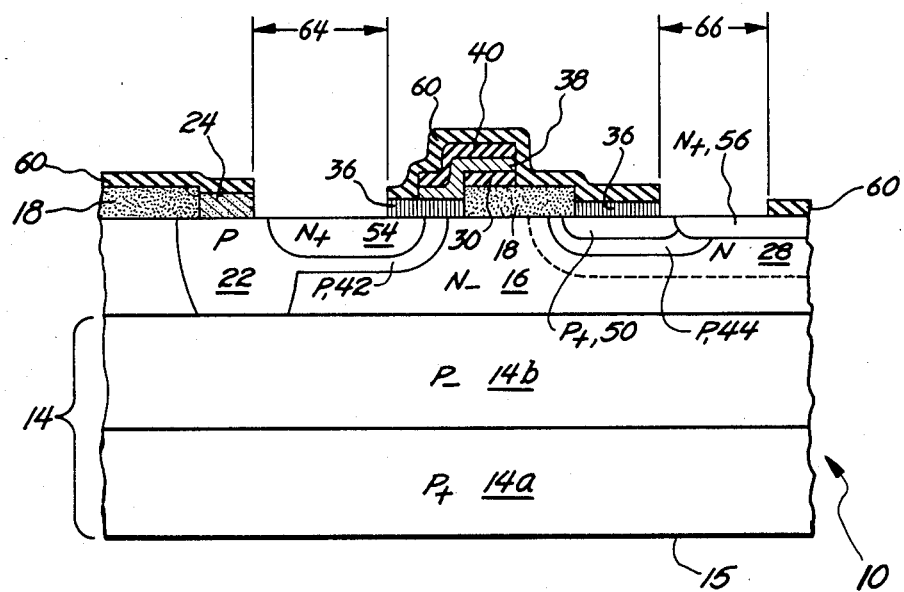
Figure 1N:
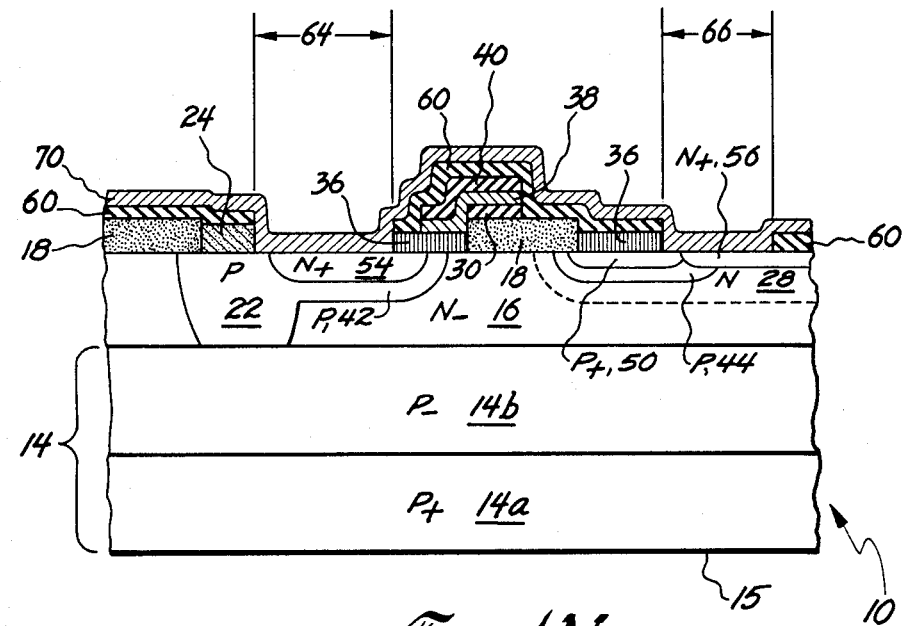
Figure 1P:
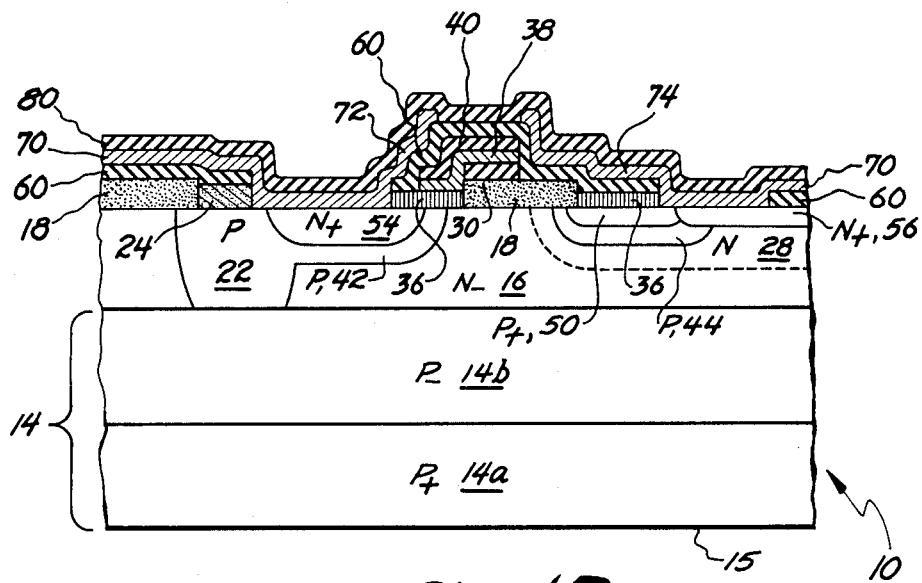
Figure 1Q:
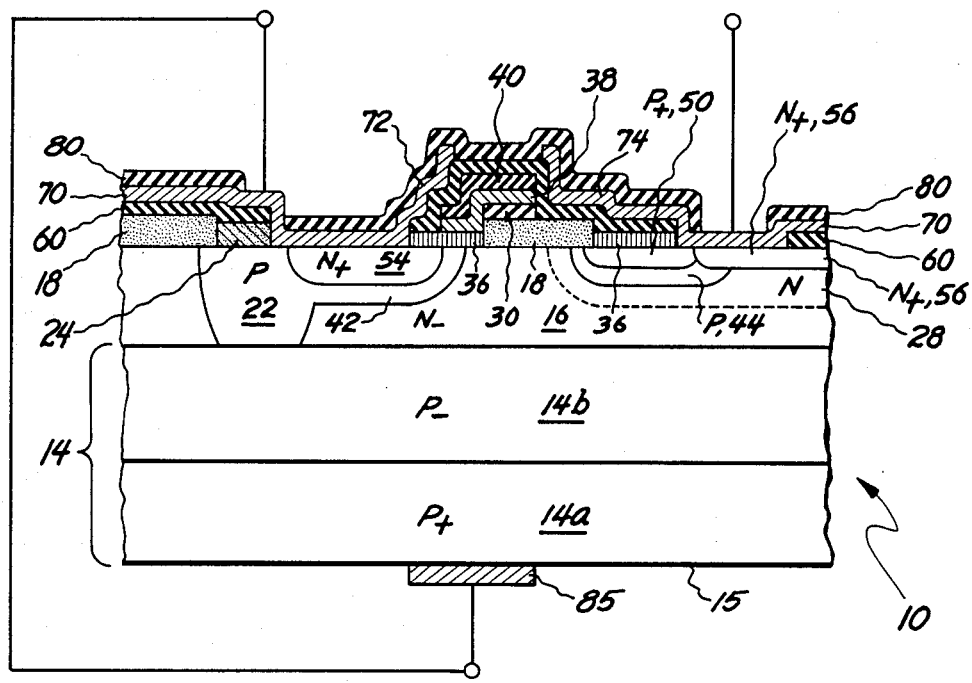

Given the corresponding relationship of FIGS. 1A–1Q, corresponding parts have been designated with the same reference numeral as an aid to understanding the description of the present invention. Various semiconductor elements, however, have not been drawn to scale. Certain dimensions have beem exaggerated in relation to other dimensions in order to present a clearer illustration and understanding of the invention. Although for the purposes of illustration the preferred embodiment of the improved minimal mask process of the present invention has been shown in each particular embodiment to include specific P and N type regions, it is understood by those skilled in the art that the teachings herein are equally applicable to a minimal mask process in which the conductivities of the various regions have been reversed to, for instance provide for the fabrication of the dual of the device.

Further, although the embodiments illustrated herein are shown in two dimensions the various regions of an actual device have length, width and depth. It is also to be understood that these regions are illustrations of only a portion of a single cell of a device which is comprised of a plurality of cells arranged in a three dimensional structure. Accordingly, these regions, when fabricated in actual devices, would generally comprise a plurality of regions having three dimensions including length, width and depth. An illustrative example of a cell of one such device could be realized by, for instance, rotating the illustration of FIG. 1Q through 360° about an axis at the far right of the illustration of FIG. 1Q.

Referring now to FIG. 1A, a minimal mask process of fabricating a lateral insulated gate semiconductor device 10 such as lateral insulated gate transistor is disclosed. The initial preparation of the semiconductor device is shown to include the steps of providing a first semiconductor layer 14 of one type conductivity such as a P layer with a second layer 16 of opposite type conductivity material such as an N type layer being disposed thereon. In one embodiment either the first or the second layer 14 or 16, respectively, can be the substrate and the other layer can be established by epitaxial growth. Alternatively, the other layer can be established by doping the substrate with the appropriate type conductivity carriers by, for instance, diffusion or implantation doping. In a preferred embodiment, the first layer 14 can comprise a heavily doped outer zone 14a forming the lower surface 15 of the device 10 and a lightly doped second zone 14b atop thereof. It is also preferred that the second layer 16 be a lightly doped layer.

Subsequently, a first protective layer 18 is established atop the second layer 16 and can, for instance, be established by growing an oxide to a thickness of approximately 1.0 microns atop the second semiconductor layer 16. In a preferred embodiment, the first protective layer 18 can, for instance, comprise a field oxide such as silicon dioxide. Subsequently, and referring now to FIG. 1B, a first mask (not shown) is used in combination with photolithographic masking techniques to define an area of a first mask in the first protective layer 18. A buffered hydrofluoric acid etch can then be used to open a first window 20 and expose a first portion 21 of the surface of the second layer 16. The exposed first portion 21 of the second layer 16 can then be doped with one type conductivity material such as boron, by for instance, diffusion or implantation techniques to establish a heavily doped P+ first region 22 exhibiting a surface doping concentration of $1 \times 10^{19}$ carriers per cubic centimeter and a depth of approximately 1 micron.

Thereafter, a second protective layer 24 which can, for instance, be a native oxide such as silicon dioxide, is established in the first window 20 to sealingly cover the first exposed surface portion 21 of the second layer 16 and the first region 22 disposed therein. Subsequently, and referring now to FIG. 1C, a second mask (not shown) is used in combination with the photolithographic techniques to define the area of a second window 25 in the first protective layer 18. A buffered hydrofluoric acid etch, for instance, can be used to open a second window 25 through the first protective layer 18 to expose a second portion 26 of the surface of the second layer 16.

The exposed second portion 26 can be doped with, for instance, a moderate concentration of an opposite type conductivity material such as phosphorus to establish a moderately doped opposite type conductivity second region 28 within the second layer 16. Subsequently, the partially processed device 10 can be exposed to an enhancement high temperature drive in which the length, depth and width of the first and second regions 22 and 28, respectively are expanded. As shown in FIG. 1D, the first region 22 is expanded to extend through the second layer 16 and make integral ohmic contact with the first layer 14. The second region 28 is expanded to form a buffer region which will prevent punch through of the first layer 14 to a subsequently established one type conductivity region.

A third protective layer 30 is formed in the second window 25 and on the exposed surface of the first and second protective layers 18 and 24, respectively. The third protective layer can be a nitride such as a silicon nitride layer which is deposited within the second window 25 and on the first and second protective layers 18 and 24, respectively. In this particular embodiment, it is preferred that a nitride third protective layer 30 be used inasmuch as the nitride is etchable by etching chemicals such as hot phosphoric acid which etch nitride alone and do not etch oxide materials. Thus, the third protective layer 30 disposed within the second window 25, can be removed at a later time to again expose a portion of the second window 25 without removing the oxide forming the first and second protective layers 18 and 24, respectively, disposed on other portions of the device.

Referring now to FIG. 1E, a third mask (not shown) is used in combination with photolithographic techniques to define the area of third and fourth windows 32 and 34, respectively, within the first, second and third protective layers 18, 24 and 30. In a preferred embodiment, the various oxide and nitride protective layers can be selectively etched by using appropriate etchants such as buffered hydrofluoric acid for oxide material and hot phosphoric acid for nitride material. In a preferred embodiment, the third mask comprises two concentric, but discrete and separate mask windows. The third window comprises an outer region which is annular or ring-shaped and substantially encircles the fourth window. The fourth window can be substantially oval in configuration and substantially concentrically disposed within the third window. The third and fourth windows 32 and 34, respectively, are opened through the first, second and third portions 37a and 37b, respectively, of the second layer 16.

As shown in FIG. 1F, a fourth protective layer such as a gate insulation layer comprising for instance a native oxide, which in this example can be silicon dioxide having a thickness of approximately 0.1 microns, is established on the surfaces 37a and 37b of the device 10 which are not covered by the third protective layer 30. In particular, the fourth protective layer 36 is deposited or grown within the third and fourth windows 32 and 34, respectively.

Referring now to FIG. 1G, a gate material layer 38 such as polysilicon or polysilicide is deposited atop the gate insulation fourth protective layer 36 and the other exposed surfaces of the device. The gate layer 38 can be doped to establish the proper conductivity. Thereafter, a fifth protective layer 40 such as a silicon dioxide insulation layer is deposited atop gate metal 38 to insulate the gate layer 38 from other portions of the device 10.

Referring now to FIG. 1H, the gate insulation layer and gate layer 40 and 38, respectively, are patterned through the use of a fourth mask (not shown) and the excess gate metal 38 and insulation material 40 is removed to uncover and re-expose a section of the third window 32 not occupied by the layers 38 and 40. Substantialy all of the fourth window 34 is also exposed. The third window 32 and the fourth window 34 remain filled with the fourth protective layer 36. Subsequently, dopants are introduced through the fourth protective layer 36 disposed in the third and fourth windows 32 and 34, respectively, to establish third and fourth regions 42 and 44. The third region 42 is established in the second layer 16 and overlaps onto the first region 22. The fourth region 44 is formed within the second region 28. The third and fourth regions 42 and 44, respectively, can be achieved by employing a moderate concentration of moderately fast diffusing one type conductivity dopant such as boron. While the regions 42 and 44 can be established by diffusion, it is preferred that the third and fourth regions 42 and 44, respectively, be established by implantation through the fourth protective layer 36. Once implanted, the one type conductivity dopants forming the third and fourth regions 42 and 44, respectively, diffuse within the second layer 16 and the second region 28 whereby a portion of the third region 42 extends beneath the gate layer 38 and a portion of the fourth region 44 extends beneath the first protective layer 18 and the third protective layer 30. The portion of the third region 42 extending beneath the gate layer 38 can ultimately be used as the channel region of the completed insulated gate device.

Referring now to FIG. 1I, a sixth protective layer 46 which can, for instance, be a photoresist layer, is deposited on the surface of the device. A fifth mask (not shown) is used to open a fifth window 48 shown in FIG. 1J through the sixth protective layer 46 to expose the fourth protective layer 36 disposed atop the fourth region 44. It is preferred that the fifth mask define an area in the sixth protective layer 46 which overlies the fourth region 44 and is preferably substantially centered within that region. After the fifth window 48 is opened through the fifth protective layer 46, a heavy concentration of one type conductivity dopants such as boron is introduced into the fourth region 44 to form a heavily doped one type conductivity ohmic contact surface region 59 adjacent the surface of the device. A portion of the region 50 extends beneath the third protective layer 30.

Referring now to FIG. 1K, the sixth protective layer 46 is thereafter removed by a photoresist stripping step. The third protective layer 39 is also removed by, for instance, employing a nitride specific etch such as hot phosphoric acid to express a fifth portion 52 of the surface of the second layer 16 as well as a portion of the fourth region 44 and the ohmic contact surface region 50. In addition, only the second protective layer 24 covers a surface portion of the first region 22 and the third region 42 and the fourth protective layer 36 covers the remaining surface of the third region 42. An opposite type conductivity dopant such as phosphorus can be introduced through the fourth protective layer 36 and into the first and third regions 22 and 42, respectively, to establish a fifth region 54 by, for instance, implantation doping. The fifth region 54 is disposed within the third region 42, and overlaps into the first region 22. Once implanted, the opposite type conductivity carriers forming the fifth region 54 diffuse such that the fifth region 54 can also extend beneath the gate layer 38. The fifth region 54 is preferably disposed in a prealigned manner within the third region 42 such that the fifth region 54 and second layer 16 in combination define a channel portion of the third region 42 disposed therebetween. It is preferred that the channel length be in the range of 1-2 microns. In forming the fifth region 54, it is recognized that better electrical connections are made between heavily doped regions and metal contact electrodes and accordingly, it is desirable that the fifth region 54 be a heavily doped opposite type conductivity region to facilitate the formation of ohmic contact with a subsequently applied metal electrode. Also, a heavily doped fifth region 54 provides better injection from the fifth region to improve the forward conduction capability of device 10.

Simultaneously, with the formation of the fifth region 54, a sixth region 56 of opposite type conductivity is also established. The sixth region 56 is established within the second layer 16 and overlaps onto the fourth and ohmic contact surface regions 44 and 50, respectively. It is also preferred that the sixth region 56 be heavily doped to provide good injection.

Referring now to FIG. 1L, the device can be completed by, for instance, depositing a low temperature oxide layer 60 over substantially the entire upper surface of the device comprising a plurality of individual cells of the insulated gate semiconductor device.

Referring now to FIG. 1M, a sixth mask (not shown) can be used in combination with photolithographic techniques to open first and second contact windows 64 and 66, respectively. The first contact window 64 is opened through the low temperature oxide 60 as well as the second and fourth protective layers 24 and 36, respectively, to expose a portion of the surface of the first region 22 and an adjacent portion of the surface of the fifth region 54. The second contact window 66 is opened through the low temperature oxide layer 60 and the fourth protective layer 36 to expose a portion of the sixth region 56 and as well as portions of the fourth region 44 and the ohmic contact region 50.

Thereafter, a metallization layer 70 shown in FIG. 1N is applied over the low temperature oxide 60 and within the contact windows 64 and 66 to make ohmic contact with the first, fifth, sixth, fourth and ohmic contact regions 22, 54, 56, 44 and 50, respectively.

Figure 10:
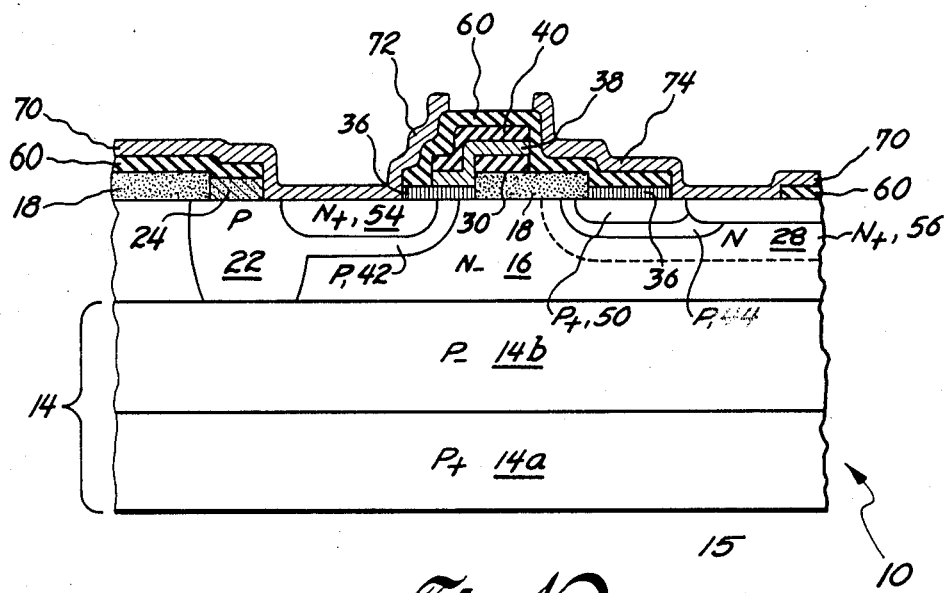

A seventh mask (not shown) can be used to divide the metallization layer 70 into first and second portions 72 and 74, respectively shown in FIG. 10. The first portion 72 can serve as the first cathode metal of the device and for instance, interconnect the first and fifth regions 22 and 54, respectively of several cells. Similarly, the second portion 74 can function as the anode metal portion of the device and can interconnect the fourth and sixth portions 50 and 56, respectively of several cells of the device 10.

Subsequently, and as shown in FIG. 1P, an overglass layer 80 can be applied to the exposed surface of the device 10. The overglass layer 80 covers the metallization layer 70 and protects the device from contamination. As shown in FIG. 1Q, an eighth mask (not shown) can be used in combination with photolithographic techniques to open windows through the overglass layer 80 to facilitate external connection to the first and second portions 72 and 74, respectively of the metallization layer 70.

It is preferred that the heavily doped portion 14a of the first layer 14 be provided with a second cathode electrode such as a metal layer 85 disposed in ohmic contact with the heavily doped portion 14a of the first layer 14. It is also preferred that the electrode 85 be coupled to the same potential as the potential applied to the fifth region 54 to obtain the maximum benefit of the vertical structure integrally formed within the device 10.

In all, it is recognized that only eight masks have been used in this preferred method of forming a lateral insulated gate semiconductor device. The gate layer 38 can be used to align the third and fifth regions 42 and 54, respectively. The third protective layer can be used to align the fourth and sixth regions 44 and 56, respectively. Accordingly, a minimal mask process of fabricating a lateral insulated gate semiconductor device has been disclosed. By way of specific example, the following device parameters are provided to further enable one skilled in the art to practice the method of the present invention. More particularly, given a substrate area and doping concentration, reference texts can be consulted to establish the precise process parameters such as temperature and exposure duration needed to establish the required device region. Reference texts which can be consulted can include "Quick Reference Manual for Silicon Integrated Circuits" by Beadle, 1985, "Physics and Technology of Semiconductor Devices", A. S. Grove, 1967. A typical method of fabricating a 500 volt lateral insulated gate transistor employs the following device parameters.

| Device Region/Layer | |
| --- | --- |
| Layer 14a thickness (P+ part) | 500 microns |
| First layer 14a resistivity | 0.01 Ω cm |
| First layer 14b thickness | 40 microns |
| First layer 14b resistivity | 50 ohm-cm |
| Second layer 16 thickness | 5 microns |
| Second layer 16 resistivity | 2 ohm-cm |
| First region 22 depth | 6 microns |
| First region 22 sheet resistance | 50 ohms per sq. |
| Second region 28 depth | 4 microns |
| Second region 28 sheet resistance | 300 ohms per sq. |
| Third region 42 depth | 3 microns |
| Third region 42 sheet resistance | 2000 ohms per sq. |
| Fourth region 44 depth | 1 micron |
| Fourth region 44 sheet resistance | 20 ohms per sq. |
| Fifth region 54 depth | 1 micron |
| Fifth region 54 sheet resistance | 10 ohms per sq. |
| First protective layer 18 thickness | 10,000 angstroms |

-continued

| Device Region/Layer | |
| --- | --- |
| Second protective layer 24 thickness | 5,000 angstroms |
| Third protective layer 30 thickness | 1,000 angstroms |
| Fourth protective layer 36 thickness | 1,000 angstroms |
| Fifth protective layer 40 thickness | 3,000 angstroms |
| Gate metal thickness | 8,000 angstroms |

As illustrated, for instance, in FIG. 1Q, it is preferred that the third and fifth regions 42 and 54 be disposed proximate the fourth and sixth regions 44 and 56 to facilitate current flow therebetween. Accordingly, the third and fifth regions 42 and 54, respectively, are disposed more proximate to the fourth region 44 than is the first region 22. In addition, the sixth region 56 is disposed more remote from either the third or fifth regions 42 and 54, respectively, than is the fourth region 44.

While the process of the present invention has been described in detail with relation to FIGS. 1A–1Q, it is recognized that more information concerning the operation of this device may be desired. Accordingly, the following brief description of the operation of this device is included and reference is made to the above referenced copending patent application Ser. No. 935,368 for further information. As shown in FIG. 1Q, the first layer 14 can be tied to the fifth region 54 of the device to thus establish a vertical integral diode between the P+ first layer 14 and the N+ sixth region 56. In operation, a negative voltage typically is applied to the fifth region 54 and the first layer 14 through an external connection. Typically, the sixth region 56 is positively biased with a potential of 2 volts. In response to an appropriate gate potential of approximately 15 volts applied to the gate electrode 38, a channel of opposite type conductivity is established in the third region 42 for conductively coupling opposite type carriers from the fifth region 54 through the third region 42 into the opposite type conductivity second layer 16. In the illustrated embodiment, opposite type conductivity regions are illustrated as N type regions and hence, electrons are conducted through the channel into the the second layer 16, and thence through the sixth region 56 to the anode metal 74. As opposite type conductivity or majority carriers continue to flow from the fifth region 54 to the sixth region 56, a potential drop is developed along the fourth region 44. Once the potential drop along the fourth region exceeds 0.7 volts, the PN junction between the second layer 16 and the fourth region 44 is forward biased causing the fourth region 44 to inject one type conductivity or minority type carriers into the second layer 16 to enhance the lateral conductivity between the cathode and anode regions of the device 10. In this instance, the region 44 injects holes into the N type conductivity second layer 16 to improve the conductivity of this layer. Forward bias current flow also occurs between the second cathode 85 and the anode 74. More particularly, the previously discussed gate induced current provides base current for a vertical transistor illustrated as a PNP transistor comprising the first layer 14; the second layer and second regions 16 and 28, respectively and the fourth and ohmic contact regions 44 and 50, respectively. This vertical transistor contributes substantially to the device current.

Under reverse bias conditions wherein the potential applied to metal 74 is more negative than the potential applied to the second cathode 85, the vertical diode comprising the sixth region 56, second region 28, second layer 16 and first layer 14 conducts.

It is recognized that while the preferred embodiments of the present invention have been disclosed with respect to a lateral insulated gate transistor, the minimal mask process for fabricating a lateral insulated gate transistor of the present invention is not so limited but is equally applicable to other lateral insulated gate devices. Further it is recognized that a reduction in mask steps improves not only the cost of production but also increases the yield or the percentages of workable devices within a given commercial specification which can be expected from any device run.

Further, although eight different masking steps are used, it is within the scope of this invention to use a single mask for two different masking steps whenever possible. In this regard, it is noted that the eight mask which is used to establish the device contacts can be the same as the sixth mask which opens the contact windows 64 and 66.

While the preferred embodiments of the present invention have been illustrated and described, it is clear that the invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A method of fabricating a lateral insulated gate semiconductor device comprising the steps of:
    (a) providing a first semiconductor layer of one type conductivity;
    (b) providing a second layer of opposite type conductivity atop said first layer;
    (c) establishing a first protective layer atop said second layer;
    (d) opening a first window in said first protective layer to expose a first surface portion of said second layer;
    (e) doping said first surface portion of said second layer with one type conductivity material to establish a first region of one type conductivity in said second layer;
    (f) forming a second protective layer in said first window;
    (g) opening a second window through said first protective layer to expose a second surface portion of said second layer;
    (h) doping said second surface portion of said second layer with opposite type conductivity material to establish a second region within said second layer;
    (i) forming a third protective layer in said first and second windows;
    (j) opening a third window through said first, second and third protective layers to expose a third surface portion of the second layer comprising a portion of the surface of said first region and said second layer;
    (k) opening a fourth window through said third protective layer to expose a fourth surface portion of said second region;
    (l) establishing a fourth protective layer within said third and fourth windows;
    (m) forming a gate layer within said third window atop said fourth protective layer;
    (n) introducing one type conductivity dopants through said third and said fourth windows to form a third region in said third surface portion of said second layer and a fourth region in said fourth surface portion of said second layer;
    (o) removing said third protective layer to expose a fifth surface portion of said second layer; and
    (p) doping said third and fifth surface portions of said second layer with opposite type conductivity impurities to establish fifth and sixth regions of opposite type conductivity wherein said fifth region is established within said third region and said sixth region is established within said second layer.

2. The method of claim 1 further including forming a fifth protective layer over said third surface portion of said second layer and doping said fourth region with a heavy concentration of one type conductivity carriers to establish a heavily doped further region within said fourth region.

3. The method of claim 1 wherein said step of providing a second layer of opposite type conductivity comprises epitaxially establishing a first zone of one type conductivity material atop said first layer, doping a portion of said first zoned with opposite type conductivity carriers to establish a second layer of opposite type conductivity atop said first layer.

4. The method of claim 3 wherein said second layer is established with a light concentration of slow diffusing opposite type conductivity impurities.

5. The method of claim 1 wherein said first region is established with a heavy concentration of fast diffusing one type conductivity carriers.

6. The method of claim 1 wherein said first region is established by implanting a heavy concentration of one type conductivity carriers within said second layer and subsequently driving said implanted carriers to extend said first region to form integral contact with said first layer.

7. The method of claim 1 wherein said first region is established by diffusing a heavy concentration of fast diffusing one type conductivity carriers into said second layer.

8. The method of claim 1 wherein said second protective layer comprises an oxide.

9. The method of claim 1 wherein said second layer comprises silicon and said second protective layer comprises silicon dioxide.

10. The method of claim 1 wherein said second region is established by exposing said second layer to a moderate concentration of opposite type conductivity fast diffusing impurities.

11. The method of claim 1 wherein said doping of said second region is accomplished by implanting a moderate concentration of fast diffusing opposite type conductivity impurity within said second layer and driving said impurity to an appropriate depth.

12. The method of claim 1 wherein said second region is established by diffusing a moderate concentration of fast diffusing opposite type impurity into said second layer.

13. The method of claim 1 wherein said third protective layer comprises a nitride.

14. The method of claim 1 wherein said second layer comprises silicon and said third protective layer comprises silicon nitride.

15. The method of claim 1 wherein said third and fourth regions are disposed in opposed relation.

16. The method of claim 1 wherein said third region encircles said fourth region.

17. The method of claim 1 wherein said fourth protective layer comprises an oxide.

18. The method of claim 1 wherein said second layer comprises silicon and said fourth protective layer comprises silicon dioxide.

19. The method of claim 1 wherein said gate layer is disposed over said fourth protective layer and a portion of said gate layer further extends over a portion of said first and third protective layers and is situated between said third and fourth regions.

20. The method of claim 19 wherein said third and fourth regions are established by exposing said second layer to a heavy concentration of fast diffusing one type conductivity impurity.

21. The method of claim 1 wherein said third and fourth regions are established by implanting a heavy concentration of fast diffusing impurities into said third and fourth surface portions of said second layer and driving said implanted impurities to appropriate depth.

22. The method of claim 1 wherein after formation of said fourth protective layer, said fourth region is doped with a heavy concentration of one type conductivity impurity to establish a heavily doped fourth region.

23. The method of claim 1 wherein said fifth region is established within said first region and said sixth region is established within said fourth region.

24. The method of claim 1 wherein said step of forming said gate layer comprises depositing a gate layer over said fourth protective layer and patterning said gate layer to expose a portion of said fourth protective layer overlying said first and third regions.

25. The method of claim 24 wherein said gate layer material comprises polysilicide.

26. The method of claim 1 wherein said gate electrode comprises polysilicon.

27. The method of claim 1 wherein said step of opening a first window includes employing a first mask in combination with photolithographic techniques to define an area within said first protective layer and employing an appropriate etchant to remove the material of said first protective layer and expose said first surface portion of said second layer.

28. The method of claim 1 further comprising:
providing a protective oxide layer on an upper surface of the device;
patterning a plurality of contact windows through said protective oxide layer;
establishing a metallization layer atop said oxide layer and contacting device regions through said contact windows;
connecting said metallization layer with external contacts, and
providing a protective overglass layer atop said metallization layer for encapsulating said device.

29. The method of claim 28 wherein metallization layer contacts first and fifth regions and said fourth and sixth regions, and further including a step of patterning said metallization layer to separate a portion of said metallization in contact with said first and fifth regions from a portion of said metallization layer in contact with said fourth and sixth regions.

30. The method of claim 1 further comprising
providing means for coupling said first layer to said fifth region.

31. The method of claim 1 further comprising
providing an electrical connection between said fifth region and said first layer.

* * * * *